(12) United States Patent
Shih et al.

(10) Patent No.: US 8,263,852 B2
(45) Date of Patent: Sep. 11, 2012

(54) INSULATING DEVICE OF CONCENTRATION PHOTOVOLTAIC HEAT SINK

(75) Inventors: Zun-Hao Shih, Taoyuan County (TW); Hwen-Fen Hong, Taoyuan County (TW); Kuo-Hsin Lin, Taoyuan County (TW)

(73) Assignee: Atomic Energy Council—Institute of Nuclear Energy Research, Lungtan, Taoyuan (TW)

( * ) Notice: Subject to any disclaimer, the term of this patent is extended or adjusted under 35 U.S.C. 154(b) by 0 days.

(21) Appl. No.: 12/144,312

(22) Filed: Jun. 23, 2008

(65) Prior Publication Data

US 2011/0011442 A1    Jan. 20, 2011

(51) Int. Cl.
*H01L 31/052* (2006.01)
*H01L 31/045* (2006.01)

(52) U.S. Cl. ........ 136/246; 136/251; 136/256; 136/244; 438/69; 438/72; 438/66; 438/73; 438/80; 257/436; 257/432; 257/717

(58) Field of Classification Search .................. 136/246, 136/251, 256, 244; 438/69, 72, 66, 73, 80; 257/436, 432, 717
See application file for complete search history.

(56) References Cited

U.S. PATENT DOCUMENTS

| | | | | |
|---|---|---|---|---|
| 3,232,795 A * | 2/1966 | Snyder et al. | ............... | 136/246 |
| 3,427,200 A * | 2/1969 | Ernest et al. | ............... | 136/246 |
| 3,437,818 A * | 4/1969 | Shattuck | ............... | 250/214 SG |
| 3,912,539 A * | 10/1975 | Magee | ............... | 136/244 |
| 4,045,246 A * | 8/1977 | Mlavsky et al. | ............... | 136/246 |
| 4,099,515 A * | 7/1978 | Schertz | ............... | 126/661 |
| 4,118,249 A * | 10/1978 | Graven et al. | ............... | 136/246 |
| 4,134,387 A * | 1/1979 | Tornstrom | ............... | 126/684 |
| 4,162,369 A * | 7/1979 | Brown et al. | ............... | 136/202 |
| 4,836,861 A * | 6/1989 | Peltzer et al. | ............... | 136/246 |
| 5,118,361 A * | 6/1992 | Fraas et al. | ............... | 136/246 |
| 5,123,968 A * | 6/1992 | Fraas et al. | ............... | 136/246 |
| 5,167,724 A * | 12/1992 | Chiang | ............... | 136/246 |
| 5,733,598 A * | 3/1998 | Sera et al. | ............... | 427/97.2 |
| 5,961,737 A * | 10/1999 | Glenn | ............... | 136/244 |
| 6,020,555 A * | 2/2000 | Garboushian et al. | ............... | 136/256 |
| 6,051,776 A * | 4/2000 | Kimata et al. | ............... | 136/246 |
| 6,091,020 A * | 7/2000 | Fairbanks et al. | ............... | 136/259 |
| 6,177,627 B1 * | 1/2001 | Murphy et al. | ............... | 136/246 |
| 6,187,150 B1 * | 2/2001 | Yoshimi et al. | ............... | 204/192.29 |
| 6,188,012 B1 * | 2/2001 | Ralph | ............... | 136/246 |
| 6,399,874 B1 * | 6/2002 | Olah | ............... | 136/259 |
| 6,528,716 B2 * | 3/2003 | Collette et al. | ............... | 136/246 |
| 6,531,653 B1 * | 3/2003 | Glenn et al. | ............... | 136/246 |
| 2003/0155003 A1 * | 8/2003 | Tur et al. | ............... | 136/246 |
| 2003/0201007 A1 * | 10/2003 | Fraas et al. | ............... | 136/246 |

* cited by examiner

*Primary Examiner* — Jonathan Johnson
*Assistant Examiner* — Golam Mowla
(74) *Attorney, Agent, or Firm* — Jackson IPG PLLC

(57) ABSTRACT

A heat sink has a number of fixing frames. The fixing frames are soldered with of solar cell devices. And, the fixing frames are defined with insulating ink. Hence, the fixing frames can be used for insulating and locating the of a solar cell devices. Besides, with the insulating ink, solar cells of the solar cell devices are prevented from being contacted with the heat sink. As a result, a good electrical property is obtained on assembling and using the solar cell devices.

4 Claims, 4 Drawing Sheets

INSULATING DEVICE OF CONCENTRATION PHOTOVOLTAIC HEAT SINK

FIELD OF THE INVENTION

The present invention relates to an insulating device; more particularly, relates to avoiding short circuiting of contacting solar cell units with a heat sink and to providing a good electrical property on assembling and utilizing the solar cell units.

DESCRIPTION OF THE RELATED ART

A general solar cell device has a heat sink of a metal layer. The heat sink is deposited with solar cell units coordinated with a cohesion layer; and the solar cell units are connected with each other through wires. Hence, outside device can be provided with required electricity by connecting to the solar cell units through transforming light energy into electric energy.

Although the solar cell device provides required electricity through transforming light energy into electric energy, the solar cell units are combined to the heat sink of the metal layer coordinated with the cohesion layer only. The solar cell units may be easily contacted with the metal layer and a short circuiting may be thus formed. Hence, the prior art does not fulfill all users' requests on actual use.

SUMMARY OF THE INVENTION

The main purpose of the present invention is to use fixing frames for insulating and locating solar cell units to avoid short circuiting of contacting the solar cell units with a heat sink and to provide a good electrical property on assembling and utilizing the solar cell units.

To achieve the above purpose, the present invention is an insulating device of concentration photovoltaic heat sink, comprising a heat sink, a plurality of fixing frames, a plurality of solar cell devices and a plurality of collectors, where the heat sink comprises a base layer and a conductive layer coated on the base layer; the fixing frames are arranged with an interval between each two frames to define a plurality of assembling areas on the heat sink and the fixing frames are formed with an insulating ink; the solar cell devices are set in the assembling areas coordinated with a cohesion layer and the solar cell devices are connected with each other through wire; and the collectors are fixed on the heat sink, corresponding to the solar cell devices. Accordingly, a novel insulating device of concentration photovoltaic heat sink is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
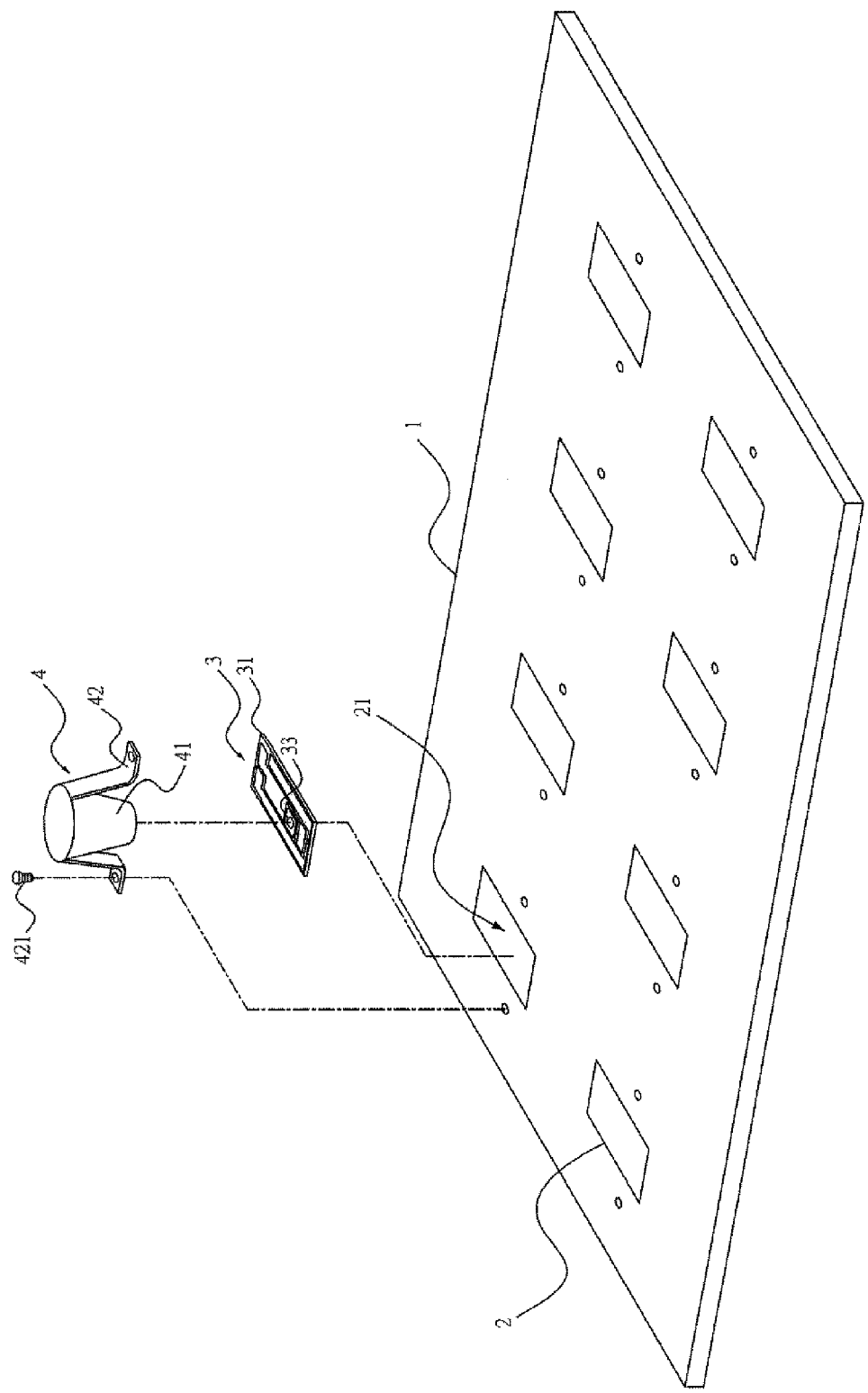
FIG. 1 is the explosive view showing the preferred embodiment according to the present invention.
Figure 2:
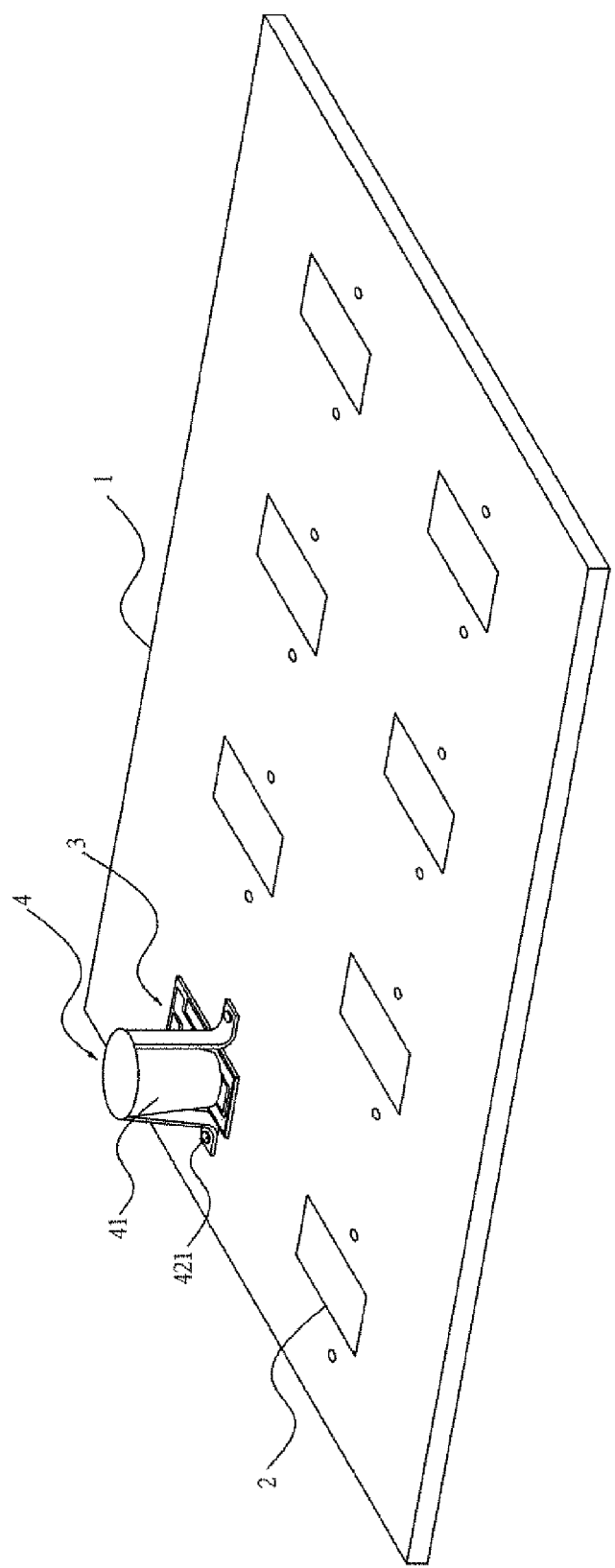
FIG. 2 is the perspective view showing the preferred embodiment.
Figure 3:
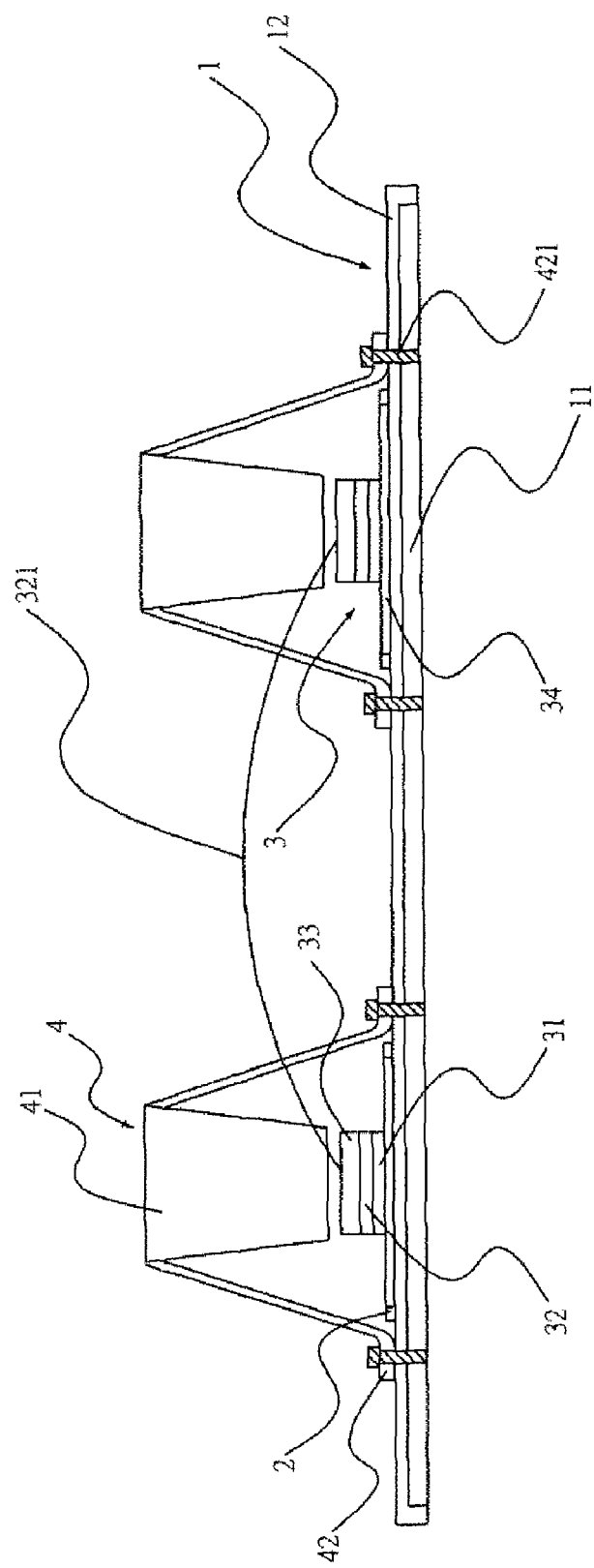
FIG. 3 is the sectional view showing the preferred embodiment.

Please refer to FIG. 1 to FIG. 3, which are an explosive view, a perspective view and a sectional view showing a preferred embodiment according to the present invention. As shown in the figures, the present invention is an insulating device of concentration photovoltaic heat sink, comprising a heat sink, a plurality of fixing frames, a plurality of solar cell units and a plurality of collectors, where the fixing frames are used for insulating and locating the solar cell units to avoid short circuiting of contacting the solar cell units with a conductive layer of the heat sink; and, thus, a good electrical property is provided on assembling and utilizing the solar cell units.

The heat sink 1 comprises a base layer 11 and a conductive layer 12 on the base layer 11, where the base layer 11 is made of aluminum and the conductive layer 12 is made of nickel.

The fixing frames 2 are arranged with a proper interval between each two fixing frames 2 to define a plurality of assembling areas 21 on the conductive layer 12; and the fixing frames 2 are formed with an insulating ink.

Each of the solar cell devices 3 is set in the assembling area 21 on the conductive layer 12. The solar cell device 3 comprises a ceramic substrate 31 on the conductive layer coordinated with a cohesion layer 34; a transmitting layer 32 on the ceramic substrate 31; and a solar cell on the transmitting layer 32. Therein, the cohesion layer 34 is made of a solder paste; and, the transmitting layers 32 of the solar cell devices 3 are connected with each other through wires 321.

The collectors 4 are fixed on the heat sink 1 and are corresponding to the solar cells 33 of the solar cell devices 3. Each of the collectors 4 comprises a cover 41 correspondingly reduced toward one of the solar cell devices 33; and standing arms 42 fixed on the heat sink 1 at two sides of the cover 41 separately, coordinated with fixing units 421. Thus, with the above structure, a novel insulating device of concentration photovoltaic heat sink is obtained.

Figure 4:
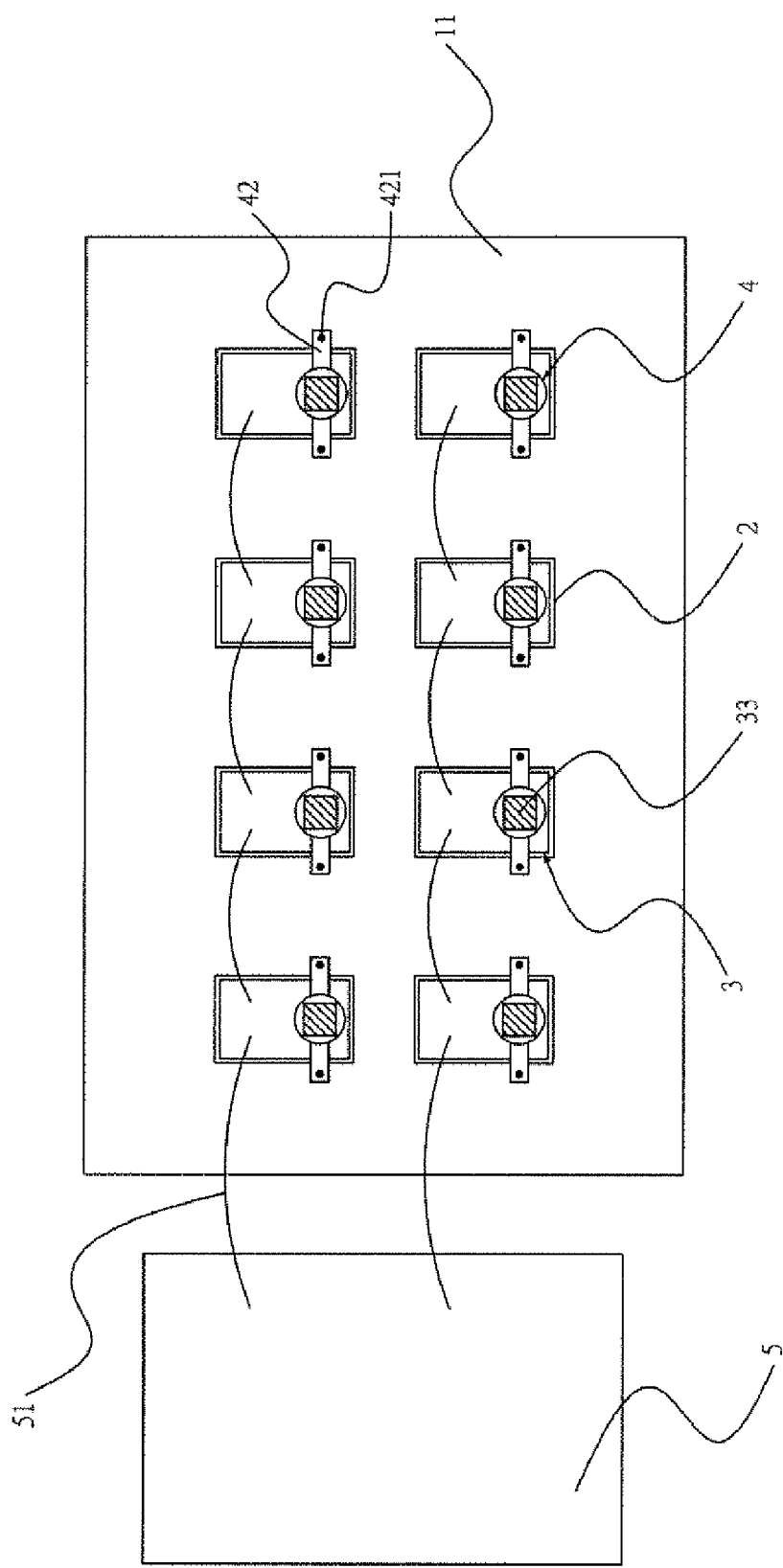
FIG. 4 is the view showing the state of use of the preferred embodiment.

Please further refer to FIG. 4, which is a view showing a state of use of the preferred embodiment. As shown in the figure, on assembling the present invention, the ceramic substrates 31 of the solar cell devices are set in the assembling areas 21 defined on the conductive layer 12 of the heat sink 1 separately, coordinated with the cohesion layers 34; the covers 41 of the collectors 4 are correspondingly set over the solar cells 33; and, the standing arms 42 are fixed to the heat sink 1, coordinated with the fixing units 421. Thus, the present invention is assembled, where the solar cell devices 3 are easily located in the assembling areas 21 by using the fixing frames 2 for avoiding short circuiting of contacting metal material at upper layer with the conductive layer 12 of the heat sink 1 on assembling the solar cell devices 3.

On using the present invention, an outside electric device 5 is connected with the transmitting layer 32 of the solar cell devices with wires 51, where the covers 41 are used to focus outside light source on the solar cells to transform light energy into electric energy for providing required operational electricity to the outside electric device 5.

To sum up, the present invention is an insulating device of concentration photovoltaic heat sink, where fixing frames are used for insulating and locating solar cell units to avoid short circuiting of contacting the solar cell units with a heat sink; and, thus, a good electrical property is provided on assembling and utilizing the solar cell units.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An insulating device of concentration photovoltaic heat sink, comprising:
    a heat sink, said heat sink comprising a base layer made of aluminum and a conductive layer made of nickel;
    a plurality of fixing frames, said fixing frames being arranged with an interval between each two said fixing frames to define a plurality of assembling areas on said conductive layer, said fixing frames formed from insulating ink;
    a plurality of solar cell devices, each of the solar cell devices set in a respective assembly area so as to be insulated from short circuiting with the conductive layer and each of the solar cell devices comprising:
    a ceramic substrate formed on the conductive layer coordinated with a cohesion layer of solder paste wherein said cohesion layer of solder paste directly joins said ceramic substrate to said conductive layer;
    a transmitting layer on said ceramic substrate; and
    a solar cell on said transmitting layer, said solar cell devices being deposited in said assembling areas coordinated with the cohesion layer, said transmitting layers of the solar cell devices being connected with each other through wires; and
    a plurality of collectors, each of said collectors being fixed on said heat sink and corresponding to a respective one of said solar cell devices.

2. The device according to claim 1, wherein said collector comprises
    a cover being reduced toward said solar cell device; and
    standing arms being fixed on said heat sink at two sides of said cover.

3. The device according to claim 1, wherein each of said fixing frames is configured to frame said cohesion layer of solder paste in said assembling areas.

4. The device according to claim 1, wherein each of the collectors comprises a cover correspondingly reduced toward a respective solar cell device and standing arms arranged at two sides of the cover and coordinated with fixing units.

* * * * *